United States Patent [19]

Taneya et al.

[11] Patent Number: 4,870,651
[45] Date of Patent: Sep. 26, 1989

[54] SEMICONDUCTOR LIGHT-EMITTING APPARATUS

[75] Inventors: Mototaka Taneya, Ibaraki; Mitsuhiro Matsumoto; Sadayoshi Matsui, both of Tenri, all of Japan

[73] Assignee: Sharp Kabushiki Kaisha, Osaka, Japan

[21] Appl. No.: 127,836

[22] Filed: Dec. 2, 1987

[30] Foreign Application Priority Data

Dec. 5, 1986 [JP] Japan ................................ 61-291299

[51] Int. Cl.⁴ ................................................ H01S 3/19
[52] U.S. Cl. ........................................ 372/50; 372/18; 372/20; 372/23; 372/29
[58] Field of Search ........................ 372/50, 20, 18, 23, 372/97, 29, 32

[56] References Cited

U.S. PATENT DOCUMENTS

| | | | |
|---|---|---|---|
| 4,111,521 | 9/1978 | Streifer et al. | 372/50 |
| 4,464,759 | 8/1984 | Haus et al. | 372/18 |
| 4,631,730 | 12/1986 | Miller | 372/32 |
| 4,667,331 | 5/1987 | Alferness et al. | 372/20 |
| 4,720,468 | 1/1988 | Menigaux et al. | 372/50 |

FOREIGN PATENT DOCUMENTS 0159258 10/1985 European Pat. Off. .
0187581 7/1986 European Pat. Off. .
0111383 6/1984 Japan ................................... 372/32

OTHER PUBLICATIONS

Taneya et al., (1985) Appl. Phys. Letters 47(4):341-343 "O° Phase Mode Operation . . . Branching Waveguide").
Cullus et al. (1979) Journal of Physics 12 (8):688-689; "A Device for Laser Beam Diffusion and Homogenisation".
Patent Abstracts of Japan 8 (68), P-264, 1505, Mar. 30, 1984; "Semiconductor Laser Module"; Morimoto.
Matsumoto et al. (1985) J. Appl. Phys. 58 (7):2763-2785; "Stable Supermode Operation in Phase-Locked Laser Diode Arrays with Three Index Waveguides".

*Primary Examiner*—William L. Sikes
*Assistant Examiner*—Xuân Thi Võ
*Attorney, Agent, or Firm*—Irell & Manella

[57] ABSTRACT

A semiconductor light-emitting apparatus comprising a semiconductor laser array device with a plurality of lasing filaments and a mode-mixing device with a striped optical waveguide that attains an optical phase-coupling with the semiconductor laser array device, whereby beams from the semiconductor laser array device are emitted from the light-emitting facet of the semiconductor light-emitting apparatus via the mode-mixing device, thereby attaining a near-field pattern with a minimized ripple rate on the optical intensity.

2 Claims, 3 Drawing Sheets

SEMICONDUCTOR LIGHT-EMITTING APPARATUS

BACKGROUND OF THE INVENTION

1. Field of the invention:

This invention relates to a semiconductor light-emitting apparatus that has a low ripple rate on the optical intensity of the near-field pattern.

2. Description of the prior art:

Semiconductor laser devices that are useful as light sources for optical discs, laser printers, optical communication systems, etc., must produce high output power. For this purpose, semiconductor laser array devices, in which a plurality of waveguides are disposed in a parallel manner to achieve an optical phase-coupling between the adjacent waveguides, have been studied by, for example, the inventors of this invention, Applied Physics Letters, Vol. 47(4) PP. 341-343 (1985).

However, the studies of semiconductor laser array devices have been focused on the production of high output power and/or the attainment of oscillation in a transverse mode with a 0° -phase shift, but they have not been focused on the uniformity of the optical intensity of their near-field patterns. For example, the inventors of this invention have experimentally obtained the near-field pattern shown in FIG. 5 by the use of a loss-guided semiconductor laser array device with three waveguides (Journal of Applied Physics, Vol. 58(7), PP. 2783-2785 (1985)). This array device produced high output power of 100 mW or more, but it can be seen from FIG. 5 that the ripple rate of the optical intensity of the near-field pattern is as high as 100%. That is, the optical intensity of the near-field pattern lacks uniformity.

The above-mentioned array device having a high ripple rate of the optical intensity of the near-field pattern is not applicable to optical systems in which the near-field pattern of the array device is utilized.

SUMMARY OF THE INVENTION

The semiconductor light-emitting apparatus of this invention, which overcomes the above-discussed and numerous other disadvantages and deficiencies of the prior art, comprises a semiconductor laser array device with a plurality of lasing filaments and a mode-mixing device with a striped optical waveguide that attains an optical phase-coupling with the semiconductor laser array device, whereby beams from the semiconductor laser array device are emitted from the light-emitting facet of the semiconductor light-emitting apparatus via the mode-mixing device, thereby attaining a near-field pattern with a minimized ripple rate on the optical intensity.

In a preferred embodiment, the semiconductor laser array device and the mode-mixing device are separately mounted on a stepped heat-sink in such a manner that the level of the active layer of the semiconductor laser array device becomes equal to the level of the optical waveguide of the mode-mixing device.

In a preferred embodiment, the semiconductor laser array device and the mode-mixing device are integrated as a united body on a single substrate.

Thus, the invention described herein makes possible the objective of providing a semiconductor light-emitting apparatus that has a minimized ripple rate on the optical intensity of the near-field pattern.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor light-emitting apparatus that has a semiconductor laser array device and a mode-mixing device achieving an optical phase-coupling therebetween. Beams from the light-emitting spots of the semiconductor laser array device are incident upon the mode-mixing device in which the beams overlap, resulting in the emission of light, from the mode-mixing device, which has a minimized ripple rate on the optical intensity.

EXAMPLE 1

Figure 1A:
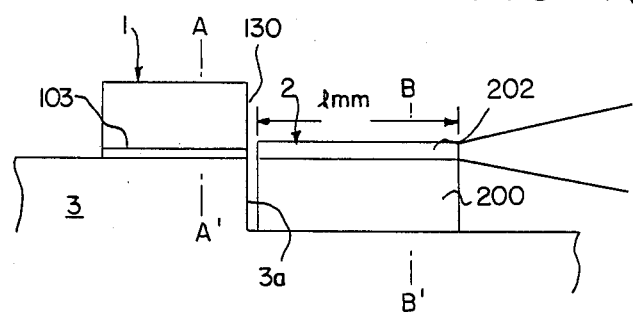
FIG. 1(a) is a schematic diagram showing a semiconductor light-emitting apparatus of this invention.

FIG. 1(a) shows a semiconductor light-emitting apparatus of this invention, which comprises a semiconductor laser array device 1 and a mode-mixing device 2 achieving an optical phase-coupling with the semiconductor laser array device 1.

Figure 1B:
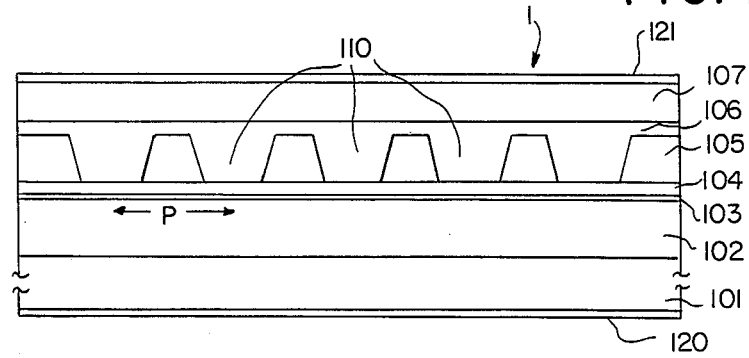
FIG. 1(b) is a sectional front view of the light-emitting apparatus taken along line A—A' of FIG. 1(a).

The semiconductor laser array device 1 is produced as follows:

As shown in FIG. 1(b), on the flat surface of an n-GaAs substrate 101, an n-$Al_xGa_{1-x}As$ cladding layer 102 having a thickness of 0.8 μm, an $Al_yGa_{1-y}As$ active layer 103 having a thickness of 0.08 μm, a first p-$Al_xGa_{1-x}As$ cladding layer 104 having a thickness of 0.2 μm, an n-current blocking layer 105 having a thickness of 0.8 μm are successively grown by metal-organic chemical vapor deposition, molecular beam epitaxy, liquid phase epitaxy or the like. Then, on the resulting wafer, a plurality of channels 110 (the width of each channel being 4 μm and the distance from the center of one channel to the center of the adjacent channel being 7 μm) are formed in the n-current blocking layer 105 by the use of a known photolithographic technique and an etchant containing $NH_4OH$ and $H_2O_2$ in the proportion of one to twenty. The n-current blocking layer 105 alone is etched into a plurality of channels 110 by the etchant, but the p-$Al_xGa_{1-x}As$ cladding layer 104 is not etched by the etchant. Thereafter, on the wafer with these channels 110, a second p-Al$_x$Ga$_{1-x}$As cladding layer 106 having a thickness of 0.8 μm with regard to the portions positioned in the channels 110 and a p-GaAs contact layer 107 having a thickness of 1.0 μm are successively grown by metal-organic chemical vapor deposition. Then, the upper face of the contact layer 107 and the back face of the substrate 101 are subjected to a vapor deposition treatment with metal materials of Au-AuZn and AuGe-Ni, respectively, followed by heating at 450° C. to form a p-sided electrode 121 of an alloy of Au-AuZn and an n-sided electrode 120 of an alloy of AuGe-Ni. Thereafter, the wafer is cleaved to form a laser resonator having a cavity length of about 250 μm. Both facets are coated with dielectric multi-layered films so as to obtain a reflective index of 3% with regard to the front facet (i.e., the light-emitting facet) and a reflective index of 95% with regard to the rear facet, resulting in a desired semiconductor laser array device.

Figure 1C:
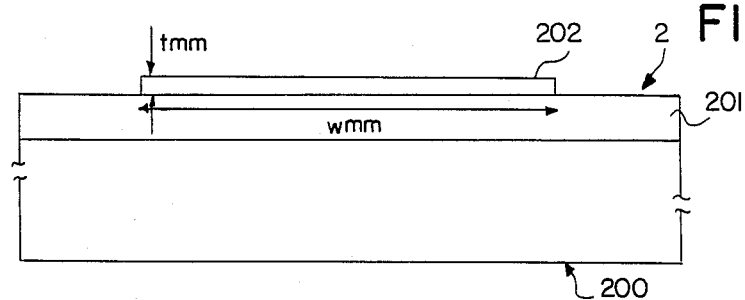
FIG. 1(c) is a sectional front view of the light-emitting apparatus taken along line B—B' of FIG. 1(a).

The mode-mixing device 2 is produced as follows: As shown in FIG. 1(c), on a Si substrate 200, a SiO$_2$ film 201 having a refractive index of 1.48 and a thickness of 1.0 μm and a Si$_3$N$_4$ film 202 having a refractive index of 1.97 and a thickness of 1.0 μm are successively disposed by the high-frequency spattering method. Then, the Si$_3$N$_4$ film 202 is formed into a stripe having a width W$_{MM}$ of 70 μm by the use of a known photolithographic technique and an etchant that mainly contains phosphoric acid. The striped Si$_3$N$_4$ film functions as a waveguide. Then, the wafer is cleaved in a length l$_{MM}$ of about 200 μm, resulting in a mode-mixing device with a rectangular optical waveguide.

The semiconductor laser array device 1 is mounted on a heat-sink 3 by the use of a soldering material such as In such a manner that the grown layer-side thereof comes into contact with the heat-sink 3. The heat-sink 3 has a step 3a between the portion on which the semiconductor laser array device 1 and the mode-mixing device 2 are mounted, respectively. The height of the step 3a is set so that the level of the active layer 103 of the semiconductor laser array device 1 becomes equal to the level of the optical waveguide 202 of the mode-mixing device 2. The mode-mixing device 2 is mounted on the heat-sink 3 by the use of a soldering material such as In.

The reflective index of each of the facets of the mode-mixing device 2 is set to be 3% or less, so that beams of the semiconductor laser array device 1, which are incident upon the facet of the mode-mixing device 2, can be prevented from being reflected by the facet of the mode-mixing device 2 and entering the semiconductor laser array device 1. In order that the semiconductor laser array device 1 and the mode-mixing device 2 can effectively achieve an optical phase-coupling therebetween, the distance therebetween is set to be preferably 30 μm or less.

Figure 2A:
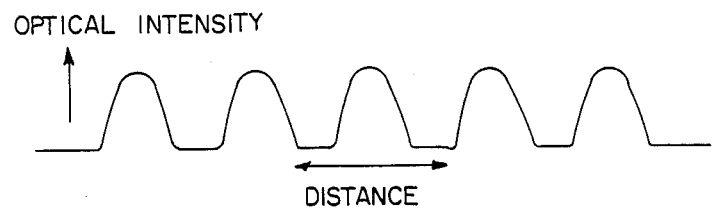
FIG. 2(a) and 2(b), respectively, are graphs showing the near-field patterns at the light-emitting facet of a semiconductor laser array device of this invention and the light-emitting facet of a mode-mixing device of this invention.
Figure 2B:
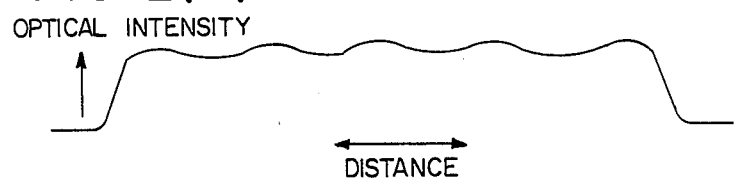
Figure 3:
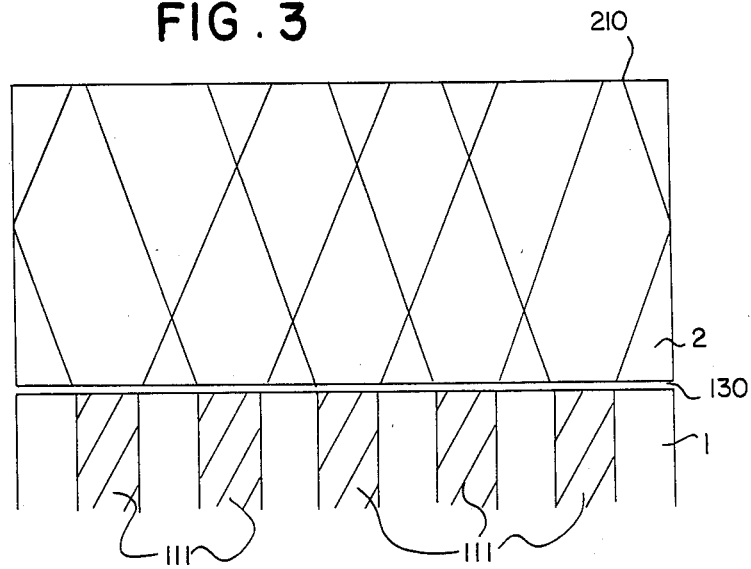
FIG. 3 is a diagram showing the operation principle of a mode-mixing device of this invention.

The operation principle of the semiconductor light-emitting apparatus of this example is described below: FIG. 2(a) shows the near-field pattern at the light-emitting facet 130 (FIG. 1(a)) of the semiconductor laser array device 1, which indicates that the ripple rate of the optical intensity of the near-field pattern is 100% that is the same as that of the optical intensity of the near-field pattern of a conventional semiconductor laser array device. The behavior of the optical waves within the mode-mixing device 2 is shown in FIG. 3. The length l$_{MM}$ of the mode-mixing device 2 meets the following inequality:

$$l_{MM} > \frac{P_{max}}{n_{MM} \tan(\theta/2)}$$

wherein P$_{max}$ indicates the maximum value of the distance between the adjacent light-emitting spots of the semiconductor laser array device, θ indicates the full angle at half maximum of the far-field pattern in the direction that is parallel to the active layer of each of the laser units constituting the semiconductor laser array device, and n$_{MM}$ indicates the equivalent refractive index of the optical waveguide of the mode-mixing device. When the length of the mode-mixing device meets the above-mentioned inequility, beams from the individual lasing filaments 111 of the semiconductor laser array device 1 overlap within the mode-mixing device until the opticalwaves reach the light-emitting facet 210 of the mode-mixing device 2. The near-field pattern at the light-emitting facet 210 of the mode-mixing device 2 is that as shown in FIG. 2(b), indicating that the ripple rate of the optical intensity is as low as 5% or less. The device that has the above-mentioned distribution of the optical intensity on the near-field pattern is most useful as a light source of optical systems in which the optical intensity must be uniform at the image formation point.

EXAMPLE 2

Figure 4A:
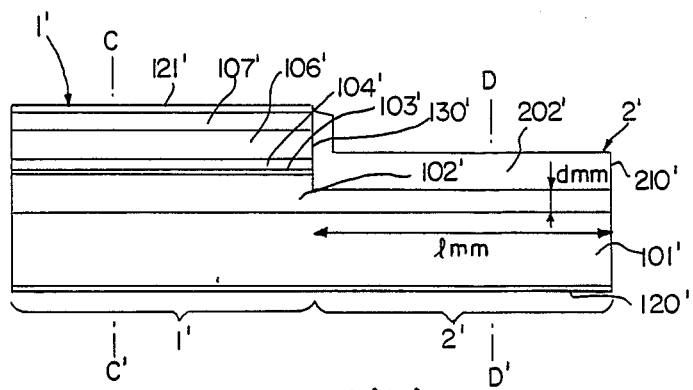
FIG. 4(a) is a sectional front view showing another semiconductor light-emitting apparatus of this invention.
Figure 4B:
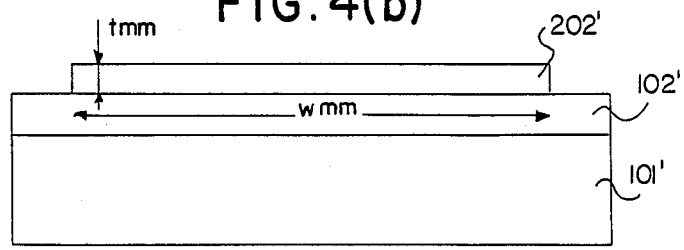
FIG. 4(b) is a sectional front view of the semiconductor light-emitting apparatus taken along line C—C' of FIG. 4(a).
Figure 5:
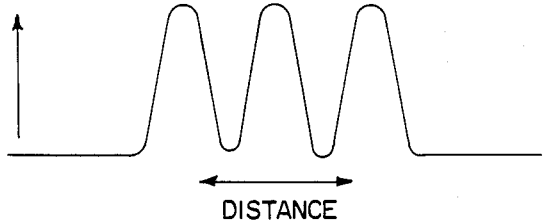
FIG. 5 is a graph showing the near-field pattern attained by a conventional semiconductor laser array device.

FIG. 4(a) and 4(b) show another semiconductor light-emitting apparatus of this invention, in which a semiconductor laser array device or portion 1' and a mode-mixing device or portion 2' are integrated in a single substrate 101'. A sectional front view of this semiconductor light-emitting apparatus taken along line C—C' of FIG. 4(a) is the same as that of the semiconductor light-emitting apparatus of Example 1 shown in FIG. 1(b).

This semiconductor light-emitting apparatus is produced as follows On an n-GaAs substrate 101', an n-Al$_x$Ga$_{1-x}$As cladding layer 102' having a thickness of 1.2 μm, an Al$_y$Ga$_{1-y}$As active layer 103' having a thickness of 0.08 μm, a first P-Al$_x$Ga$_{1-x}$As cladding layer 104' having a thickness of 0.2 μm, and an n-GaAs current blocking layer 105' having a thickness of 0.8 μm are successively grown by metal-organic chemical vapor deposition, molecular beam epitaxy, liquid phase epitaxy or the like. Then, a plurality of channels are formed in the current blocking layer 105' in the same way as described in Example 1. Then, a second P-Al$_x$Ga$_{1-x}$As cladding layer 106' having a thickness of 0.8-1.0 μm with regard to the portions positioned within the channels and a p$^+$-GaAs contact layer 107' having a thickness of 1.0 μm are successively grown by metal-organic chemical vapor deposition, liquid phase epitaxy or the like.

Thereafter, a portion of the wafer is removed by a reactive ion beam etching technique so as to reach the n-cladding layer 102' through the active layer 103', resulting in a laser light-emitting facet 130' of the laser array portion 1'. The thickness of the remaining n-cladding layer 102' is about 0.4 μm. Then, on the remaining cladding layer 102', a Si$_3$N$_4$ film 202' having a thickness of 1.5 μm is deposited by plasma assisted chemical vapor deposition, followed by subjecting said film to a photolithographic treatment and an etching treatment to form into a stripe as shown in FIG. 4(b). The striped Si$_3$N$_4$ film 202', which has a thickness t$_{MM}$ of about 1.5

μm, a width $W_{MM}$ of 70 μm and a length $l_{MM}$ of about 100 μm, functions as an optical waveguide. Then, an n-ohmic contact 120' and a p-ohmic contact 121' are formed on the back face of the substrate 101' and the upper face of the contact layer 107' of the semiconductor laser array portion 1', respectively. The other facet of the laser array portion 1' is formed by cleavage, resulting in a desired semiconductor light-emitting apparatus. This semiconductor light-emitting apparatus produced a near-field pattern at the light-emitting facet 210' operates on the same principle as described in Example 1. The near-field pattern exhibited a low ripple rate on the optical intensity that is the same as that of the optical intensity shown in FIG. 2(b).

As mentioned above, according to this invention, a semiconductor light-emitting apparatus that attains a near-field pattern with a minimized ripple rate of the optical intensity can be obtained.

This invention is not limited to the above-mentioned examples, but it is, of course, applicable to the following devices:

(i) Semiconductor laser array devices of gain-guided types, effective refraction types, wide-stripe types etc., other than the semiconductor laser array device of the above-mentioned examples;

(ii) AlGaAs mode-mixing devices with waveguide structures including buried types or ridged types that are different from the mode-mixing devices with the waveguide structure of the above-mentioned examples;

(iii) Semiconductor light-emitting apparatus with joint structures other than the joint structure described in Example 2 in which the active layer of the semiconductor laser array portion and the optical waveguide of the mode-mixing portion are optically jointed to each other by a bud joint structure; for example, a semiconductor light-emitting apparatus in which the optical guiding layer of a mode-mixing device attains an optical phase-coupling with the extended heterostructures sandwiching the active layer therebetween of a semiconductor laser array device in the direction that is longitudinal to the principal plane of the devices, or a semiconductor light-emitting apparatus in which an extension of the optical guiding layer formed on the upper or lower surface of the active layer of a semiconductor laser array device functions as an optical waveguide of a mode-mixing device, and:

(iv) Semiconductor light-emitting apparatus with polarities different from those of the semiconductor light-emitting apparatus of the above-mentioned examples.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor light-emitting apparatus, a semiconductor laser array device that has a substrate and a plurality of lasing filaments formed within an active layer that is disposed on said substrate, said lasing filaments being parallel to each other and vertical to the facets of said laser array device, and a mode-mixing device that has a striped optical waveguide with a certain length, said striped optical waveguide attaining an optical phase-coupling with said semiconductor laser array device by disposing said semiconductor laser array device and said mode-mixing device in such a manner that the level of the active layer of said semiconductor laser array device becomes equal to the level of the optical waveguide of said mode-mixing device, and said length $l_{MM}$ of said striped optical waveguide of said mode-mixing device being represented by the following inequality:

$$l_{MM} > \frac{P_{max}}{n_{MM} \tan(\theta/2)}$$

wherein $P_{max}$ indicates the maximum value of the distance between adjacent light-emitting spots of the semiconductor laser array device, $\theta$ indicates the full angle at half maximum of the far-field pattern in the direction that is parallel to the active layer constituting the lasing filaments of the semiconductor laser array device, and $n_{MM}$ indicates the equivalent refractive index of the optical waveguide of the mode-mixing device, whereby beams from said semiconductor laser array device are emitted form a light-emitting facet of said semiconductor light-emitting apparatus via said mode-mixing device, thereby attaining a near-field pattern with a minimized ripple rate on the optical intensity.

2. A semiconductor light-emitting apparatus according to claim 1, wherein said semiconductor laser array device and said mode-mixing device are integrated as a united body on a single substrate.

* * * * *